United States Patent
Thijs et al.

[11] Patent Number: 5,914,496
[45] Date of Patent: Jun. 22, 1999

[54] RADIATION EMITTING SEMICONDUCTOR DIODE OF BURIED HETERO TYPE HAVING CONFINEMENT REGION OF LIMITED AL CONTENT BETWEEN ACTIVE LAYER AND AT LEAST ONE INP CLADDING LAYER, AND METHOD OF MANUFACTURING SAME

[75] Inventors: Petrus J.A. Thijs; Teunis Van Dongen, both of Eindhoven, Netherlands

[73] Assignee: Uniphase OPto Holdings, Incorporated, San Jose, Calif.

[21] Appl. No.: 08/822,818

[22] Filed: Mar. 24, 1997

[30] Foreign Application Priority Data

Mar. 28, 1996 [EP] European Pat. Off. .............. 96200858

[51] Int. Cl.$^6$ .................................................. H01L 33/00
[52] U.S. Cl. .............................. 257/14; 257/96; 257/101; 257/103
[58] Field of Search .................................. 257/14, 94, 96, 257/101, 103, 22; 372/45, 46

[56] References Cited

FOREIGN PATENT DOCUMENTS

| | | |
|---|---|---|
| 0293000 | 11/1988 | European Pat. Off. . |
| 0353054 | 1/1990 | European Pat. Off. . |
| 0480780 | 4/1992 | European Pat. Off. . |
| 07202260 | 8/1995 | Japan . |

OTHER PUBLICATIONS

"Novel Etching Technique for a Buried Heterostructure GaInAs/AlGaInAs Quantum–Well Laser Diode", by A. Kasukawa et al, Appl. Phys. Lett. 59 (11), Sep. 9, 1991, pp. 1269–1271.

"Very Low Threshold Current OmCVC Grown 1.5$\mu$m GaInAs/AlGaInAs Buried Heterostructure Quantum Well Laser Diode Using A Novel Etching Technique", by A. Kasukawa et al, LEOS 91, Proc. pp. 60–61, 1991.

*Primary Examiner*—Minh Loan Tran
*Attorney, Agent, or Firm*—Michael A. Glenn

[57] ABSTRACT

A radiation-emitting semiconductor diode of a buried hetero type having an active layer situated between two InP cladding layers with a confinement layer of limited Al content disposed between the active layer and one or both of the InP cladding layers. The active region has an emission wavelength above 1 $\mu$m and forms part, together with the separate confinement layer and the InP cladding layers, of a strip-shaped region which is surrounded by a current-blocking third cladding layer of InP. The separate confinement layer (s) of the inventive diode includes a semiconductor material with a most 30% aluminum, and preferably at most 20% aluminum, or an aluminum-free semiconductor material. The diode has reduced starting current increases over time so as to increase the life of the diode. A method of manufacturing such a diode is also provided.

18 Claims, 2 Drawing Sheets

RADIATION EMITTING SEMICONDUCTOR DIODE OF BURIED HETERO TYPE HAVING CONFINEMENT REGION OF LIMITED AL CONTENT BETWEEN ACTIVE LAYER AND AT LEAST ONE INP CLADDING LAYER, AND METHOD OF MANUFACTURING SAME

BACKGROUND OF THE INVENTION

1. Field of The Invention

The invention relates to a radiation-emitting semiconductor diode, in particular a laser (amplifier) diode, comprising a semiconductor body with a semiconductor substrate of a first conductivity type on which a semiconductor layer structure is present which comprises in that order a first cladding layer of InP and of the first conductivity type, an active layer, a second cladding layer of InP and of a second conductivity type opposed to the first, and at least one separate confinement layer situated between the active layer and the first or second cladding layer, while the substrate and the second cladding layer are provided with electrical connections such that, given a sufficient current strength in the forward direction across a pn junction formed between the first and the second cladding layer and within a strip-shaped active region of the active layer, radiation can be generated whose wavelength is greater than or equal to 1 $\mu$m, and in which semiconductor body a strip-shaped region is present which comprises at least the second cladding layer, the separate confinement layer, and the active layer and which is bounded on either side by a third cladding layer of InP. The invention also relates to a method of manufacturing such a diode.

Such a diode is used inter alia as a transmitter or amplifier in systems for optical glass fiber communication. In that case the emission/amplification wavelength often lies between 1.3 and 1.6 $\mu$m.

2. Description of The Related Art

Such a diode is known from "Novel etching technique for a buried heterostructure GaInAs/AlGaInAs quantum-well laser diode" by A. Kasukawa et al., published in Appl. Phys. Lett. 59(11), Sep. 9, 1991, pp. 1269–1271. This relates to a so-called SIPBH (Semi-Insulating Planar Buried Hetero) diode with InP cladding layers and an active layer of GaInAs/AlGaInAs on an InP substrate. A strip-shaped region of the diode here comprises the upper cladding layer, the active layer, and two separate confinement layers adjoining the latter. The strip-shaped region is bounded on either side by an InP current-blocking layer. The active layer has an MQW (=Multi Quantum Well) structure. The separate confinement layers comprise a GRIN (=GRaded INdex) portion which is 0.1 $\mu$m thick and comprises AlGaInAs of which the aluminum content shows a gradient from 20% to 38%, and a 0.1 $\mu$m thick portion which comprises AlGaInAs with an aluminum content of 38%. Such a diode of the buried hetero type has particularly attractive properties such as a low starting current, a stable lateral modus, a substantially circular-symmetrical radiation beam, and a low parasitic capacitance. The use of GaInAs(P)/AlGaInAs for the active layer has the important advantage over the alternative GaInAs(P)/GaInAsP that the jump in the conduction band is much greater, which gives the diode a particularly high efficiency and a low starting current, while the latter quantity in addition increases little with an increase in temperature.

A disadvantage of the known diode is that its starting current rises comparatively strongly in time. This renders the diode unsuitable for use in an optical communication system because a useful life of, for example, 20 to 25 years is required for this, whereas the known diode shows an inadmissible increase in the starting current after 500 to 1,000 hours already.

BRIEF SUMMARY OF THE INVENTION

The present invention has for its object inter alia to provide a radiation-emitting semiconductor diode which does not have the above disadvantage, or at least to a much lesser degree, and which accordingly shows no or substantially no increase in the starting current in time.

According to the invention, a radiation-emitting semiconductor diode of the kind mentioned in the opening paragraph is for this purpose characterized in that the separate confinement layer comprises an aluminum-containing semiconductor material with at most 30% aluminum, and preferably at most 20% aluminum, or an aluminum-free semiconductor material. The invention is based inter alia on the surprising recognition that the increase in the starting current is caused by degradation of the diode owing to the presence of oxygen-containing material at the lateral side of the strip-shaped region contiguous to the third cladding layer. Such oxygen-containing material is formed at the area of a side face of the separate cladding layer upon exposure to the atmosphere after the strip-shaped region has been formed and before the third cladding layer is provided. The presence of aluminum plays a part in the formation of said oxygen-containing material. Apparently the oxide formed cannot be reduced at a temperature at which the diode is manufactured or to which the diode can be exposed without damage. When the aluminum content of an aluminum-containing material of the separate confinement layer is limited to a maximum of 30%, and preferably to a maximum of 20%, according to the invention, it is found that a sufficiently small quantity of the oxygen-containing material is formed in general, at least so small that it causes no or at least substantially no degradation. As a result, a diode according to the invention has a particularly long life and is particularly suitable for use in a system for optical communication.

It is noted that it is known per se that the growing of especially aluminum-containing semiconductor layers on an aluminum-containing surface gives rise to problems. U.S. Pat. No. 4,800,565 and U.S. Pat. No. 5,058,120 demonstrate this for diodes in the (Al)GaAs/AlGaAs material system ($\lambda$=0.7 to 0.9 $\mu$m) and in the (Al)GaInP/AlGaInP material system ($\lambda$=0.5 to 0.7 $\mu$m), respectively. In a material system in which the cladding layers comprise InP, i.e. are free from aluminum, a problem related to the aluminum content was not previously observed. The occurrence of said problem is also surprising because the third cladding layer of InP in the present diode, which is of the so-called buried hetero type, is not provided on a comparatively large surface of an aluminum-containing material, as in the known cases, but exclusively against the lateral side of a comparatively thin separate confinement layer. It is also surprising that the maximum admissible aluminum content of the material of the separate confinement layer is comparatively high, i.e. 30 or at any rate 20%.

In a preferred embodiment of a diode according to the invention, the separate confinement layer comprises AlGaInAs. This has the advantage that, if the active layer also comprises AlGaInAs, the separate confinement layer can be manufactured from one and the same material. The composition of such a material may be varied in that the concentration of exclusively the group III elements is varied. This can be better controlled than a variation of the concentrations of both the group III elements and the group V elements. The separate confinement layer may have a constant aluminum content which is the same as or greater than that of the active layer or—in the case of a MQW active layer—the barrier layers thereof. It is also possible, indeed favorable, for the aluminum content of the separate confinement layer to show a gradient in its thickness direction. In that case, the maximum aluminum content must comply with the condition as defined according to the invention. The bandgap for InP-matching AlGaInAs with 30% aluminum is 1.20 eV, corresponding to $Al_{0.30}Ga_{0.18}In_{0.52}As$, while for 20% the bandgap is 1.06 eV, corresponding to $Al_{0.20}Ga_{0.28}In_{0.52}As$.

In a modification which is also favorable, the separate confinement layer comprises GaInAsP. With this aluminum-free material, the separate confinement layer can have a bandgap between 0.80 eV ($Ga_{0.42}In_{0.58}As_{0.90}P_{0.10}$) and 1.35 eV (InP). A lower limit which is of more use in practice lies at 0.95 eV ($Ga_{0.28}In_{0.72}As_{0.60}P_{0.40}$). All these materials match the InP lattice. The degradation of a diode according to this modification is very small and its life is long thanks to the fact that the separate confinement layer is free from aluminum.

It is noted that the separate confinement layer may alternatively be built up from various sub-layers of different materials, for example AlGaInAs and GaInAsP. It is also possible to vary the composition within a material. This means that bandgap and refractive index may show gradients within the separate confinement layer. Preferably, the separate confinement layer has a bandgap and refractive index which lie between those of the active layer and of the first or second cladding layer. The optical confinement then extends—in contrast to the electrical confinement—(mainly) in the separate confinement layers (and a small portion of the cladding layers). As a result of this, the efficiency of the diode is very high, the starting current very low, and its useful life very long. The latter effects are strongest in the case of a bandgap gradient: low adjacent the active layer and high adjacent the cladding layer.

The best results are obtained when the active layer has a MQW structure. The quantum well layers then preferably comprise GaInAs or GaInAsP and the barrier layers AlGaInAs. The latter layers are also subject to the condition that the aluminum content must not be higher than 30%, and preferably not higher than 20%. A usual emission wavelength lies between 1.3 and 1.6 $\mu$m, which implies that the aluminum content of the barrier layer will (have to) be lower than 20%.

The substrate of the diode according to the invention preferably comprises InP so that the lattice of the comparatively thick cladding layers of InP show a good matching. The substrate may alternatively be, for example, of Si. Preferably, the third cladding layer is current-blocking and comprises semi-insulating (Fe-doped) InP, or comprises a number of layers alternately of p-InP and n-InP which during operation form current-blocking pn junctions. The diode according to the invention preferably is a laser diode of the buried hetero type in which the strip-shaped region also comprises the first cladding layer and/or part of the substrate.

A method of manufacturing a radiation-emitting semiconductor diode laser whereby a semiconductor layer structure is provided on a semiconductor substrate of a first conductivity type, which structure is formed by an active layer situated between two cladding layers comprising InP and having mutually opposed conductivity types, with at least one separate confinement layer lying between the active layer and the first or second cladding layer and with a pn junction with which, given a sufficient current strength in the forward direction of the pn junction, electromagnetic radiation can be generated in a strip-shaped active region of the active layer with a wavelength greater than or equal to 1 $\mu$m, whereby a strip-shaped region is formed which comprises at least the second cladding layer and the active layer and which is bounded on either side by a third cladding layer of InP, and whereby the substrate and the second cladding layer are provided with electrical connections, is characterized according to the invention in that an aluminum-containing semiconductor material with at most approximately 30, and preferably at most 20% aluminum, or an aluminum-free semiconductor material is chosen for the separate confinement layer. A diode according to the invention is obtained by such a method in a simple manner. Preferably, the strip-shaped region is formed, preferably by etching, after at least the first cladding layer, the active layer, and the second cladding layer have been provided in a first growing process, whereupon the third cladding layer is provided in a second growing process.

BRIEF DESCRIPTION OF THE DRAWINGS

The invention will now be explained in more detail with reference to an embodiment and the accompanying drawing in which FIG. 1 diagrammatically and in perspective view shows an embodiment of a radiation-emitting semiconductor diode according to the invention.

The Figures are diagrammatic and not drawn true to scale, the dimensions in the thickness direction being particularly exaggerated for greater clarity.

DETAILED DESCRIPTION OF THE INVENTION

Figure 1:
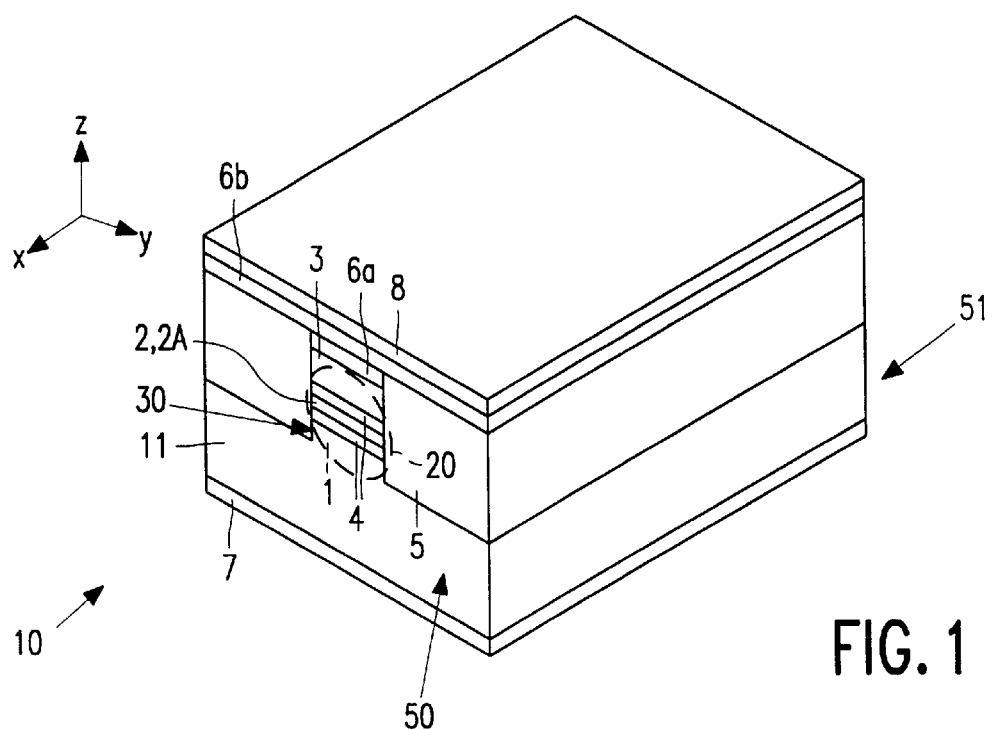
Figure 2:
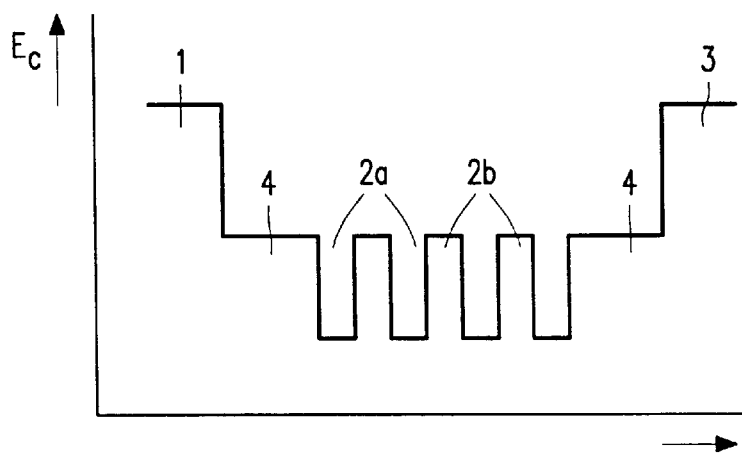
FIG. 2 is a diagram showing the conduction band as a function of the thickness in a portion of the layers of a first modification of the diode of FIG. 1.
Figure 3:
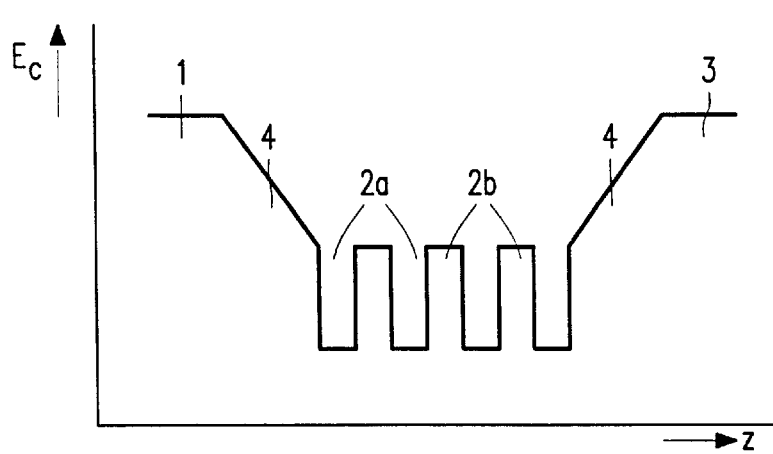
FIG. 3 is a diagram showing the conduction band as a function of the thickness in a portion of the layers of a second modification of the diode of FIG. 1, and FIGS. 4 and 5 diagrammatically show the diode of FIG. 1 in consecutive stages of its manufacture by a method according to the invention.

FIG. 1 diagrammatically and in perspective view shows an embodiment of a radiation-emitting semiconductor diode according to the invention. FIGS. 2 and 3 are diagrams showing the conduction band as a function of the thickness in a portion 20 of the layers of a first and a second modification, respectively, of the diode of FIG. 1. The diode in this example is a diode laser and will be mostly referred to as diode for short hereinafter. The diode comprises a semiconductor body 10 with a substrate 11, here made of InP, and of a first, here the n conductivity type, provided with a metal layer 7, on which substrate a semiconductor layer structure is present with an active layer 2 situated between a first and a second InP cladding layer 1, 3 and having a pn junction, here between the cladding layers 1, 3 which are of the first, accordingly the n conductivity type and of a second conductivity type opposed to the first, so the p type. The first cladding layer 1 in this example forms part of the substrate 11. Given a sufficient current strength in the forward direction, the pn junction is capable of generating electromagnetic radiation with a wavelength greater than 1 $\mu$m within a strip-shaped active region 2A of the active layer 2 which forms part of a strip-shaped region 30 of the semiconductor body 10 which also comprises the second cladding layer 3, and here also the first cladding layer 1, and which is surrounded by a current-blocking third cladding layer 5 of Fe-doped InP. The diode is provided with two end faces 50, 51 which extend parallel to the plane of drawing and which bound the strip-shaped active region 2A, thus defining a resonant cavity required for laser operation. The diode further comprises a first contact layer 6a which lies within the strip-shaped region 30 and a second contact layer 6b which extends over the entire surface of the diode and is provided with a metal layer 8. The metal layers 7, 8 form electrical connections 7, 8 for the diode.

There is at least one separate confinement layer 4 between the active layer 2 and the first and second cladding layers 1, 3. In this example, the diode comprises two separate confinement layers 4, i.e. on either side of the active layer 2. According to the invention, the separate confinement layer 4 comprises an aluminum-containing semiconductor material with an aluminum content of at most 30, but preferably at most 20% aluminum, or an aluminum-free semiconductor material. In a first modification (see FIG. 2), the separate confinement layer comprises AlGaInAs with an aluminum content of 16%. The diode in this embodiment has an exceptionally long life. When the aluminum content of the second confinement layer 4 is limited according to the invention, no or at least substantially no oxygen-containing material will be formed at the lateral side of the separate confinement layer 4 after the formation of the strip-shaped region 30 and before the provision of the third cladding layer 5. In that stage, indeed, an exposure of said lateral surface to an environment containing oxygen is inevitable. Degradation of the diode apparently does not take place, or at least to a very small extent, because very little oxygen-containing material is formed.

Thus an increase in the starting current in time of on average 10% per 500 hours was found for the known diode (six diodes measured during 600 hours) with a spread of also 10%. These quantities were 0% and 2%, respectively, for a diode according to the invention, i.e. the first modification mentioned above. The Table below lists materials, compositions, conductivity types, doping concentrations, and thicknesses of the diode of this modification. $\Delta a/a$ therein is the relative deviation of the lattice constant with respect to the substrate 11, which is defined by the material and composition of the relevant layer.

| Layer | Semiconductor | Type | Conc. (at/cm$^3$) | d ($\mu$m) | $\Delta a/a$ (%) |
|---|---|---|---|---|---|
| 11 | InP | N | $2 \times 10^{18}$ | 350 | 0 |
| 1 | InP | N | $2 \times 10^{18}$ | 1.5 | 0 |
| 4 | Al$_{0.16}$Ga$_{0.32}$In$_{0.52}$As | — | — | 0.07 | 0 |
| 2a | Ga$_{0.38}$In$_{0.62}$As | — | — | 0.0045 | −0.6 |
| 2b | Al$_{0.16}$Ga$_{0.32}$In$_{0.52}$As | — | — | 0.013 | 0 |
| 3 | InP | P | $3 \times 10^{17}$ | 1.5 | 0 |
| 5 | InP | I | $3 \times 10^{17}$Fe | 3.2 | 0 |
| 6a | Ga$_{0.47}$In$_{0.53}$As | P | $1 \times 10^{18}$ | 0.2 | 0 |
| 6b | Ga$_{0.47}$In$_{0.53}$As | P | $5 \times 10^{18}$ | 0.3 | 0 |

In a second modification of a diode according to the invention (see FIG. 3), the separate confinement layer 4 comprises GaInAsP, i.e. a semiconductor material free from aluminum. This modification also has a very long life for the same reason as indicated above for the first modification. The bandgap of the separate confinement layers 4 gradually increases from the active layer 2 in the direction of the cladding layers 1, 3. The initial composition corresponds to, for example, Ga$_{0.28}$In$_{0.72}$As$_{0.60}$P$_{0.40}$, which matches InP, while the final composition corresponds to InP. The intermediate compositions are also chosen such that $\Delta a/a$ is approximately zero each time. Preferably, the composition changes in small steps, the following being approximately true for each constituent layer: $\Delta a/a = 0$. The total thickness of the separate confinement layer 4 in this modification is approximately 0.1 $\mu$m. There are four sub-layers in this example. Thanks to this GRIN profile, this modification of the diode has a very high efficiency and a very low starting current. The other layers of the diode in this second modification are identical to those of the first modification, for which reference is made to the above Table.

The width and length of the strip-shaped region 30, and thus of the active region 2A, are 1.5 and 250 $\mu$m, respectively. The dimensions of the semiconductor body 10 are 300×250 $\mu$m$^2$. The emission wavelength of the diode in this example is 1.480 $\mu$m.

Figure 4:
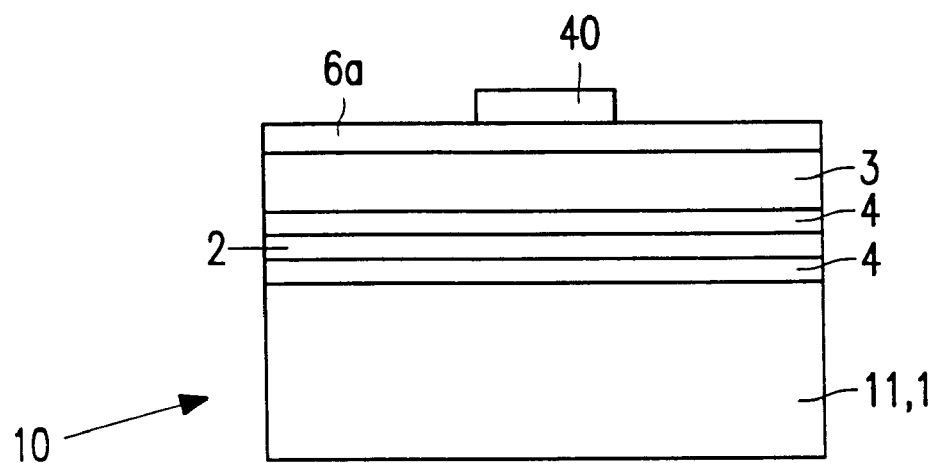
Figure 5:
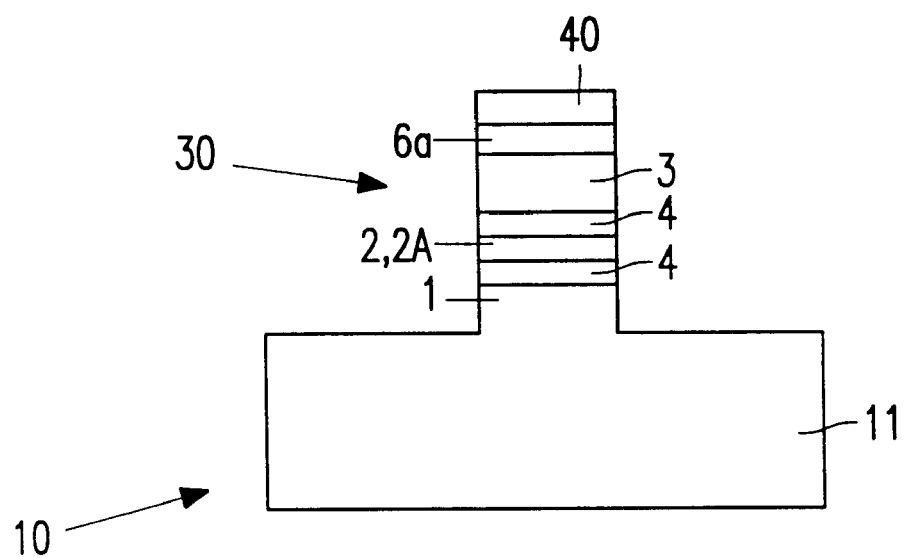

FIGS. 4 and 5 diagrammatically show the diode of FIG. 1, i.e. its modification according to FIG. 2, in consecutive stages of its manufacture by a method according to the invention. This starts with a substrate 11 of n-type InP with a thickness of approximately 360 $\mu$m, a (100) orientation, and a doping concentration of, for example, $5*10^{18}$ atoms per cm$^3$. The (upper portion 1 of the) substrate 11 here at the same time acts as the first cladding layer 1. After cleaning, a first separate confinement layer 4, an active layer 2, a second separate confinement layer 4, a second cladding layer 3, and a first contact layer 6a are provided on the substrate 11, in this example by MOVPE (=Metal Organic Vapor Phase Epitaxy). Reference is made to the Table above for the choice of materials, the composition thereof, and the thicknesses of these and further layers. The doping chosen for the p-type layers is Zn, for the n-type layers S.

After removal of the device from the growing apparatus, a masking layer of silicon dioxide (SiO$_2$) is provided, for example through sputtering. This layer is removed outside a strip-shaped mask 40 by means of photolithography and etching. Then (see FIG. 5) the semiconductor layer structure and a thin, approximately 1.5 $\mu$m thick portion of the substrate 1 are removed outside the mask 40 by means of etching, in this case RIE (=Reactive Ion Etching), whereby a strip-shaped mesa 30 is formed. After being cleaned in a usual manner, the structure obtained according to the invention is introduced into a growing apparatus again, and a third, in this case high-ohmic cladding layer 5 is provided on either side of the mesa 30 in a selective growing process, again MOVPE here, so that a plane structure results.

After removal from the growing apparatus and removal of the mask 40, the device (see FIG. 1) is placed in the (MOVPE) growing apparatus again, and a second contact layer 6b is provided over the entire upper surface. After the structure thus obtained has been taken from the growing apparatus, metal layers 7, 8 of usual composition and thickness are provided at the upper and lower side of the semiconductor body 100 in a usual manner, to which layers current supply conductors can be connected. After cleaving in two mutually perpendicular directions, the semiconductor body 10 of an individual diode is obtained and is ready for use.

The invention is not limited to the embodiments given above since many modifications and variations are possible to those skilled in the art within the scope of the invention. Thus different thicknesses, different semiconductor materials, or different compositions may be used compared with those mentioned in the examples. It is further noted that the invention may be applied not only to the SIPBH structure described in the example but also in other laser structures such as the DCPBH (=Double Channel Planar Buried Hetero) structure. It is also noted that the diode may be of the DFB (=Distributed FeedBack) or DBR (=Distributed Bragg Reflector) type instead of the FP (=Fabry-Pérot) type. It is also possible for the diode to be constructed as an amplifier instead of a radiation source. In all cases, the end faces of the diodes may be provided with suitable reflection or anti-reflection layers. It is finally noted that growing techniques other than MOVPE may be used for the growing process in a method according to the invention, such as LPE (=Liquid Phase Epitaxy), VPE (=Vapor Phase Epitaxy) or MBE (=Molecular Beam Epitaxy), or combinations thereof.

We claim:

1. A radiation-emitting semiconductor diode comprising a semiconductor body with a semiconductor substrate of a first conductivity type on which a semiconductor layer structure is present in which said semiconductor layer structure comprises, in this sequence, a first cladding layer of InP and of a first conductivity type, an active layer, a second cladding layer of InP and of a second conductivity type opposite to said first conductivity type, and said semiconductor layer structure further includes at least one separate confinement layer situated between said active layer and at least one of said first cladding layer and said second cladding layer, wherein the semiconductor substrate and said second cladding layer are provided with electrical connections such that radiation is generated whose wavelength is greater than or equal to 1 μm when sufficient current strength in the forward direction across a pn junction is formed between said first cladding layer and said second cladding layer and within a strip-shaped active region of said active layer, and said semiconductor body contains a strip-shaped region which comprises at least said second cladding layer, said separate confinement layer, and said active layer and which is bounded on either side by a third cladding layer of InP, wherein said separate confinement layer comprises an aluminum-containing semiconductor layer containing less than 20% aluminum content.

2. A radiation-emitting semiconductor diode as claimed in claim 1, wherein a first separate confinement layer is situated between said active layer and said first cladding layer, and wherein a second separate confinement layer is situated between said active layer and said second cladding layer.

3. A radiation-emitting semiconductor diode as claimed in claim 1, wherein said separate confinement layer comprises AlGaInAs.

4. A radiation-emitting semiconductor as claimed in claim 1, wherein said separate confinement layer has a bandgap and a refractive index which lie between those of said active layer and of said first cladding layer or said second cladding layer.

5. A radiation-emitting semiconductor as claimed in claim 1, wherein said bandgap and said refractive index of said separate confinement layer each show a gradient in thickness direction.

6. A radiation-emitting semiconductor as claimed in claim 1, wherein said active layer comprises a multi quantum well layer structure.

7. A radiation-emitting semiconductor as claimed in claim 6, wherein said active layer comprises quantum well layers selected from the group consisting of GaInAs and GaInAsP, and barrier layers of AlGaInAs with an aluminum content of less than 20%.

8. A radiation-emitting semiconductor as claimed in claim 1, wherein said substrate comprises InP and said third cladding layer is a semi-insulating material.

9. A radiation-emitting semiconductor as claimed in claim 1, wherein said diode is a diode laser of buried hetero type.

10. A method of manufacturing a radiation-emitting semiconductor, comprising providing a semiconductor layer structure on a semiconductor substrate of a first conductivity type, wherein said semiconductor layer structure is formed by situating an active layer between a first cladding layer and a second cladding layer each comprising InP and having mutually opposite conductivity types, and situating at least one separate confinement layer between said active layer and at least one of said first cladding layer and said second cladding layer, and including a pn junction with which, given a sufficient current strength in the forward direction of the pn junction, electromagnetic radiation is generated in a strip-shaped active region of said active layer with a wavelength greater than or equal to 1 μm, whereby a strip-shaped region is formed comprising at least said second cladding layer, the separate confinement layer, and said active layer and which is bounded on either side by a third cladding layer of InP, and wherein said semiconductor substrate and said second cladding layer are provided with electrical connections, and wherein said separate confinement layer comprises an aluminum-containing semiconductor material containing less than 20% aluminum content.

11. A method according to claim 10, wherein a first separate confinement layer is situated between said active layer and said first cladding layer, and wherein a second separate confinement layer is situated between said active layer and said second cladding layer.

12. A method according to claim 10, wherein said separate confinement layer comprises AlGaInAs.

13. A method according to claim 10, wherein said separate confinement layer has a bandgap and a refractive index which lie between those of said active layer and of said first cladding layer or said second cladding layer.

14. A method according to claim 10, wherein said bandgap and said refractive index of the separate confinement layer each show a gradient in thickness direction.

15. A method according to claim 10, wherein said active layer comprises a multi quantum well layer structure.

16. A method according to claim 15, wherein said active layer comprises quantum well layers selected from the group consisting of GaInAs and GaInAsP, and barrier layers of AlGaInAs with an aluminum content of less than 20%.

17. A method according to claim 10, wherein said semiconductor substrate comprises InP and said third cladding layer is a semi-insulating material.

18. A method according to claim 10, wherein said diode is a diode laser of buried hetero type.

* * * * *